United States Patent [19]
Zampini et al.

[11] Patent Number: 5,178,986
[45] Date of Patent: Jan. 12, 1993

[54] POSITIVE PHOTORESIST COMPOSITION WITH NAPHTHOQUINONEDIAZIDESULFONATE OF OLIGOMERIC PHENOL

[75] Inventors: Anthony Zampini; David C. Madoux; Peter Trefonas, III; Charles R. Szmanda, all of St. Louis, Mo.

[73] Assignee: Shipley Company Inc., Newton, Mass.

[21] Appl. No.: 902,458

[22] Filed: Jun. 19, 1992

Related U.S. Application Data

[63] Continuation of Ser. No. 681,617, Apr. 1, 1991, abandoned, which is a continuation of Ser. No. 258,539, Oct. 17, 1988, abandoned.

[51] Int. Cl.$^5$ .......................... G03F 7/23; G03F 7/32
[52] U.S. Cl. .................................. 430/190; 430/165; 430/191; 430/192; 430/193; 430/326; 534/557
[58] Field of Search ............... 430/192, 193, 165, 190, 430/189

[56] References Cited

U.S. PATENT DOCUMENTS

| | | | |
|---|---|---|---|
| 4,587,196 | 5/1986 | Toukhy | 430/192 |
| 4,642,282 | 2/1987 | Stahlhofen | 430/192 |
| 4,837,121 | 6/1989 | Blakeney et al. | 430/192 |

FOREIGN PATENT DOCUMENTS

| | | | |
|---|---|---|---|
| 62-123451 | 6/1987 | Japan | 430/190 |
| 62-269946 | 11/1987 | Japan | 430/190 |

OTHER PUBLICATIONS

English Translation of Japanese Publication #62-10,646, Published Jan. 19, 1987 (Kanto).
Partial English Translation of Japanese Publication #62-10,646, Published Jan. 19, 1987 (Kanto).
English Abstract of Japanese Publication #62-10, 646, Published Jan. 19,1987 (Kanto).

*Primary Examiner*—Charles L. Bowers, Jr.
*Assistant Examiner*—John S. Chu
*Attorney, Agent, or Firm*—Robert L. Goldberg

[57] ABSTRACT

A radiation sensitive oligomeric compound is described as the photoactive component with a base soluble phenolic matrix resin to provide improved photo-resist composition having high light-sensitivity, high resolution, excellent developer resistance and excellent resistance to thermal flow.

48 Claims, No Drawings

POSITIVE PHOTORESIST COMPOSITION WITH NAPHTHOQUINONEDIAZIDESULFONATE OF OLIGOMERIC PHENOL

This is a continuation of copending application Ser. No. 07/681,617, filed on Apr. 1, 1991, now abandoned, which is a continuation of Ser. No. 258,539, filed Oct. 17, 1988, now abandoned.

BACKGROUND OF THE INVENTION

1. Field of the Invention

The present invention relates generally to light-sensitive positive photoresist compositions and particularly to compositions containing aqueous-alkaline soluble phenolic resin binders together with specific naphthoquinonediazide sensitizing agents having improved solubility, improved inhibition to dissolution, and high resolution capability.

Trends in circuit design are toward increasing the scale of integration and packing density, thereby increasing performance at a reduced fabrication cost per circuit element. The progress toward higher packing densities requires the feature size of the circuit elements to be correspondingly reduced, a trend which has been continuously accelerating and which has resulted in doubling the number of components per chip every year. In these scaled down very large integrated (VLSI) circuits the integration rate is higher than 100,000, wherein the design of 1.0 $\mu$m rule or less is required. However, as this progress continues, the photolithographic processing used to delineate the circuit elements is rapidly approaching its resolution capability which is primarily limited by diffraction considerations. The resolution limit of an imaging system is a function of the wavelength of the exposing radiation, hence, higher resolution can be attained with shorter wavelength radiation. Realization of this limitation has resulted in an intensive and continuing development of other potentially higher resolution resist systems, exposure tools and associated processes.

2. Description of Prior Art

Most of the conventional positive type photoresists used for the production of integrated circuits consist of a matrix resin and a sensitizer based, in most cases, on a naphthoquinonediazidesulfonic acid ester of a substituted polyhydroxybenzophenone. The matrix resin is generally a cresylicformaldehyde novolac resin that is soluble in an aqueous alkaline solution and the naphthoquinonediazide esters function as a dissolution inhibitor for the matrix resin. Upon radiation exposure the sensitizer undergoes a structural transformation (known as the Wolff rearrangement), followed by reaction with ambient water to form a base-soluble indenecarboxylic acid that is no longer a dissolution inhibitor of the matrix resin in alkaline developer. As a result, the exposed region of the film is rendered more soluble then the unexposed, producing a differential solubility rate that is used to generate a positive-tone image of the mask.

In recent years, the positive type photoresist, based on a novolac matrix resin and a naphthoquinonediazidesulfonic acid ester sensitizer have become the material of choice in the microelectronic industry due, in part, to its potentially good resolution capabilities and dry etch resistance. In the case of VLSI, photoresists having high sensitivity and excellent stability during development and processing conditions are required to enable treatment of a great number of materials within a short period of time. However, in the prior art of positive acting photoresist compositions, attempts to minimize loss of residual film thickness in the unexposed areas of the film during development processes by increasing the amount of the naphthoquinonediazide sensitizer have produced lower sensitivity. On the other hand, when the amount of the naphthoquinonediazide sensitizer is reduced to enhance sensitivity, this results in an increase in the loss of residual film thickness in the unexposed areas of the film during the development making the product impractical. This is especially true in the case where the sensitizer used has a low diazo content, a large amount of the sensitizer is required in the photoresist composition to enhance resolution and unexposed film thickness retention. Incorporation of such large amounts of sensitizer at the expense of the novolac matrix resin, however, inevitably causes undesirable loss of adhesion of the resist film to the substrate, precipitation of the naphthoquinonediazide compound, or loss of resolving power of the photoresist.

Another fault of the prior novolac matrix resin-based positive type photoresists is the greatly reduced sensitivity in the mid-UV region (300 to 380 nm) of the ultraviolet spectrum relative to their performance in the near-UV region (380 to 450 nm). The reasons for this reduced performance are the results of several and cummulative undesirable optical properties. Firstly, the molar extinction coefficient of the naphthoquinonediazide sensitizers that are used in the prior novolac matrix resin-based positive type photoresist compositions are very high in the region of 300 to 380 nm compared to that at 436 nm. Secondly, the naphthoquinonediazide sensitizers undergo photochemistry upon ultraviolet radiation exposure which ultimately leads to a photoproduct that is transparent at 436 nm but strongly absorbs in the region of 300 to 390 nm, resulting in incomplete photobleaching. Finally, the novolac matrix resins used in most of the prior positive type photoresist compositions have a significant unbleachable absorbance in the region of 300 to 320 nm, but are essentially transparent above 350 nm.

For overcoming the above-mentioned problems, the present inventors have conducted extensive research to improve the useful properties of the prior art positive-type photoresists. As a result, it has been found that the above mentioned problems can be overcome by incorporating a specific naphthoquinone-(1,2)-diazide-(2)-sulfonyl compound to an alkali-soluble phenolic matrix resin.

SUMMARY OF THE INVENTION

Accordingly, it is the object of the present invention to produce a novel positive-acting photoresist composition.

Another object of the present invention is to produce a light-sensitive composition for the preparation of a positive acting photoresist which is a mixture of an base-soluble matrix resin and an oligomeric compound of the formula:

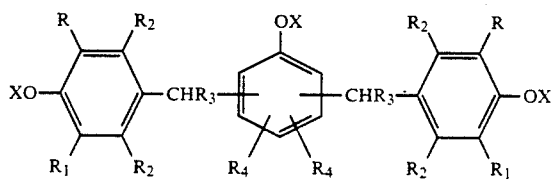

where: X is hydrogen or a naphthoquinone-(1,2)-diazide-(2)-sulfonyl residue; but at least one X is a naphthoquinone-(1,2)-diazide-(2)-sulfonyl residue; R, $R_1$, $R_2$ and $R_4$ are hydrogen, a halogen, an alkyl group free of a tertiary alpha-carbon atom, an alkoxy group having 1 to 4 carbon atoms, an aryl group or an arylalkyl group; in addition, $R_2$ and $R_4$ may be a nitro or an acyl group having 2 to 4 carbon atoms; and $R_3$ is hydrogen, an alkyl, an aryl, or a heterocyclic group, but preferably is H; in addition $R_4$ may be a tertiary alkyl group.

A further object of the present invention is to produce a light-sensitive composition comprising a naphthoquinonediazidesulfonic acid ester which exhibits high light-sensitivity and excellent developer resistance.

An additional object of the present invention is to produce a light sensitive composition comprising a naphthoquinonediazidesulfonic acid ester which can be used in the mid-UV and near-UV region of the ultraviolet spectrum.

A still further object of the present invention is to produce a light-sensitive composition comprising a naphthoquinonediazidesulfonic acid ester which exhibits high resolution and good resistance to thermal flow.

Additionally, it is an object of the present invention to produce a light-sensitive composition comprising a naphthoquinonediazidesulfonic acid ester and additives which exhibits good control of reflection effects.

Still other objects will be made apparent to those knowledgeable in the art by the following specification and claims.

DETAILED DESCRIPTION OF THE INVENTION

The present invention provides a novel light-sensitive composition for the preparation of a positive-acting resist which is a mixture of a base-soluble matrix resin and an oligomeric naphthoquinonediazidesulfonic acid ester of formula I:

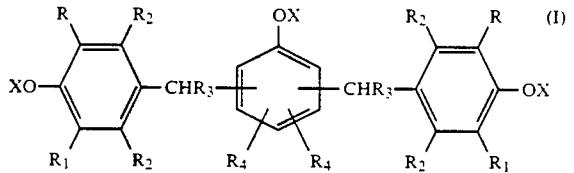

where: X is hydrogen or a naphthoquinone-(1,2)-diazide-(2)-sulfonyl residue, but at least one X is a naphthoquinone-(1,2)-diazide-(2)-sulfonyl residue; R, $R_1$, $R_2$ and $R_4$ are hydrogen, a halogen, an alkyl group free of a tertiary alpha-carbon atom, an alkoxy group having 1 to 4 carbon atoms, an aryl group or an arylalkyl group; in addition, $R_2$ and $R_4$ may be a nitro or an acyl group having 2 to 4 carbon atoms; and $R_3$ is hydrogen, an alkyl, an aryl or a heterocyclic group, but preferably is H; in addition $R_4$ may be a tertiary alkyl group.

The combination of the light-sensitive composition of this invention with the base-soluble phenolic matrix resin produces a novel photoresist composition which exhibits high light-sensitivity, high resolution, excellent developer resistance, and excellent resistance to thermal flow. Furthermore, depending on the naphthoquinonediazidesulfonic acid ester used, the photoresist composition of the invention can be used in the mid-UV, near-UV, deep-UV and x-ray regions and with energetic electron and ion-beams.

The naphthoquinonediazide derivatives contained in the composition according to this invention are prepared by methods known to those skilled in the art such as, for example, by combining one mole of the alkylated phenolic compound of formula II:

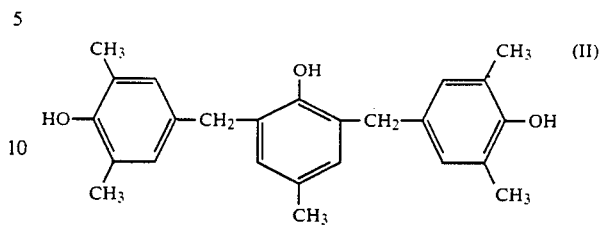

and three moles of naphthoquinone-(1,2)-diazide-(2)-sulfonyl chloride in an inert solvent in the presence of a base. Appropriate solvents for the reaction include acetone, 1,4-dioxane and tetrahydrofuran. Appropriate bases for the reaction include alkali carbonates, alkali hydroxides and trialkylamine. Preferably, the base is an admixture of triethylamine and a sulfonyl transfer reagent such as 4-dimethylaminopyridine and the solvent is a water soluble ether such as dioxane or tetrahydrofuran.

Suitable light-sensitive compositions are produced when the molar ratio of the amount of the substituted phenolic compound to the amount of the naphthoquinonediazidesulfonyl chloride employed in the esterification reaction lie in the range from 1.0:1.0 to 1.0:3.0, preferably from 1.0 part of the substituted phenolic compound to 2.0 to 3.0 parts of the naphthoquinonesulfonyl chloride.

The substituted phenolic compounds are produced by methods known to those skilled in the art such as, for example, by condensing, in a strong acid, mixtures of monosubstituted and 2,6-disubstituted phenols with an active carbonyl compound, preferably formaldehyde, as described in Ang. Makromol. Chem., 67 (1978) 175. Alternately, the substituted phenolic compounds are produced by condensing, in strong acid, formula III compounds with formula IV compounds, or preferably formula V compounds with formula VI compounds as described in Brit. Polym. J., 18 (1986) 171. The phenolic compounds that are produced may be symmetrical or unsymmetrical depending on the reactant starting mixture used.

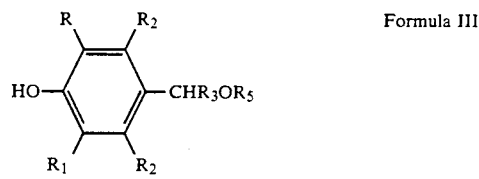

Formula III

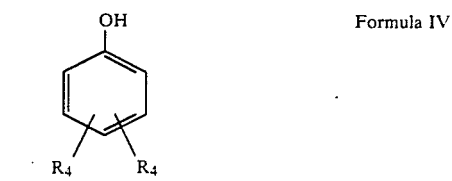

Formula IV

-continued

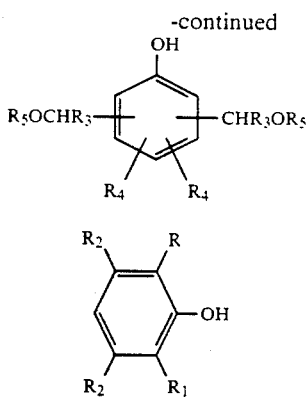

Formula V

Formula VI where: R, $R_1$, $R_2$ and $R_4$ are hydrogen, an alkyl group free of a tertiary alpha-carbon atom, an alkoxy group having 1 to 4 carbon atoms, an aryl group or an arylalkyl group; $R_3$ is hydrogen, an alkyl, an aryl, or a heterocyclic group, but preferably is H; in addition $R_4$ may be a tertiary alkyl group; and $R_5$ is hydrogen, an alkyl or an acyl group, but preferably is hydrogen or methyl.

Other condensation products comprising not only the said three hydroxyphenyl rings containing compound, but also higher oligomeric condensates, are formed under some conditions, e.g., long reaction time, high reaction temperature, and type and concentration of the acid catalyst used during the condensation reaction. As described in J. D. Roberts and M. C. Caserio, Basic Principles of Organic Chemistry, W. A. Benjamin, Inc., New York, 1965, pg. 809, alkylation is usually one of the least selective of the electrophilic aromatic substitution reactions. This is often due to the reversibility of the reaction and, at equilibrium, formation of the more stable products. Such migration of the alkyl groups, in effect, increases the number of reactive sites available on the aromatic ring and under appropriate reaction conditions leads to the formation of oligomeric products. Benzylether formation can also lead to the formation of other types of oligomeric condensates. The higher oligomers may form as little as 2 weight percent up to about 50 weight percent of the condensation product and can greatly effect the performance characteristics of the naphthoquinonediazidesulfonic acid esters derived from them.

Optionally, the properties of the naphthoquinonediazidesulfonic acid esters may be further modified such as, for example, by acylation, alkylation, halogenation or nitration of the previously formed phenolic condensation products described hereabove prior to the esterification reaction.

The naphthoquinone-(1,2)-diazide-(2)-sulfonyl residue X may be either a naphthoquinone-(1,2)-diazide-(2)-4-sulfonyl residue or a naphthoquinone-(1,2)-diazide-(2)-5-sulfonyl residue. Preferably, X is a naphthoquinone-(1,2)-diazide-(2)-4-sulfonyl residue.

In general, naphthoquinonediazide compounds have limited solubility in organic solvents. However, the naphthoquinonediazide derivatives of the general formula (I) are easily dissolved in organic solvents normally used to make resist solutions despite their high naphthoquinonediazide content. Furthermore, these compounds have the additional advantage of strongly inhibiting dissolution of the resin matrix binder in the presence of the alkaline developer solution, thus requiring smaller amounts of the naphthoquinonediazide derivative to attain the desired lithographic performance.

Another advantage of the present invention is the high sensitivity of the naphthoquinonediazidesulfonic acid ester. The photoacid product formed upon photolysis has low absorbancy above 310 nm, hence, greater efficiency and resolution is obtained for a given radiation dose. When this is combined with the lower absorbance of the resist due to lower concentration of the naphthoquinonediazidesulfonic acid ester enhanced speed and productivity of the image forming process are obtained.

In this invention, the total amount of the component represented by the general formula I is 4-40 parts by weight, preferably 6-30 parts by weight and most preferably from about 8-20 parts by weight, per 100 parts by weight of the base-soluble novolac matrix resin. If the amount is less than 4 parts by weight, the yield of residual film thickness after development becomes insufficient, and a pattern of low utility is produced. If the amount is greater than than 40 parts by weight the photoresist has low sensitivity.

Into the positive-acting photoresist composition of this invention, other naphthoquinonediazide compounds may be incorporated, if desired, in an amount of, for example, 30 parts by weight or less, preferably 10 parts by weight or less, per 100 parts by weight of the base-soluble matrix resin. These naphthoquinonediazide compounds may comprise naphthoquinone-(1,2)-diazide-(2)-4-sulfonyl and naphthoquinone-(1,2)-diazide-(2)-5-sulfonyl esters of aliphatic alcohols, pyrogallyl alkyl ketone, polypyrogallyl alkyl ketone, pyrogallyl aryl ketone, pyrogallyl hydroxyaryl ketone, mono and dihydroxyaryl alkyl ketone, mono and dihydroxyaryl aryl ketone, polyvinylphenol, alkylated polyvinylphenol, phenol aldehyde resin and alkylated phenol aldehyde resin. Such blends can improve solubility, dissolution rates, coating properties, contrast, etch resistance, photospeed, resolution or feature profiles. For example, the naphthoquinonediazide esters of the present invention can be blended with the naphthoquinonediazide esters of trihydroxybenzophenone, typically in a 1:20 to 20:1 ratio, while maintaining approximately the same total content of naphthoquinone diazide residue in the resist composition. Alternatively, the total amount of blended naphthoquinone diazide residue in the photoresist composition can be increased or decreased, as desired, to maximize desired lithographic performance.

The matrix resin of this invention is a polymeric, water insoluble resinous binder which dissolves in the solvents used for the mixture of the invention and is also soluble in aqueous alkaline solutions. Preferably, the matrix resin is a hydroxy aryl-based resin such as novolac, modified novolac, polyvinyl phenol or copolymers of vinylphenol resins. Most preferably, the resin is a cresol containing novolac matrix resin. Such resins, in conjunction with the light-sensitive composition of the present invention, promote a sharp differentiation between the exposed and unexposed areas of the positive-acting photoresist upon development.

The cresol containing novolac matrix resins used in this invention can be manufactured by an addition-condensation reaction of a phenol and an aldehyde in the presence of an acid or a divalent metal salt catalyst. Preferably the mole proportion of the aldehyde to the phenol is 0.6-1.0. As the phenol, there may be used phenol, m-cresol, o-cresol, p-cresol, m-ethylphenol, o-ethylphenol, p-ethylphenol, m-butylphenol, o-butylphenol, p-utylphenol, trimethylsilylphenol, chloromethylphenol, 2,3-dimethylphenol, 2,4-dimethylphenol, 2,5-dimethylphenol, 2,6-dimethylphenol, 3,4-dimethylphenol, 3,6-dimethylphenol, p-phenylphenol, catechol, resorcinol and the like. These phenols may be used either alone or in admixture of two or more, depending on the dissolution properties desired. As the aldehyde, there may be used formaldehyde, paraformaldehyde, acetaldehyde, benzaldehyde, furfural and the like. As the acid catalyst, there may be used inorganic acids such as hydrochloric acid, nitric acid, sulfuric acid and the like, organic acids such as formic acid, oxalic acid, maleic acid and the like and divalent inorganic metal salts of copper, cobalt, magnesium, manganese, nickel, zinc and the like.

The preferred cresol novolac matrix resin of the present invention is produced by condensing formaldehyde with a mixture of cresol isomers, wherein the percentage values of the cresol isomers in the cresol mixture are given by the following two compositions: 1) less than 10 percent ortho-cresol, 40 to 45 percent meta-cresol and 45 to 60 percent paracresol; and 2) 43 to 46 percent meta-cresol and 54 to 57 percent para-cresol.

Another useful novolac matrix resin binder that can be used with the radiation-sensitive composition of the present invention can be produced by the condensation of a bishydroxymethylated phenolic compound such as 2,6-bis(hydroxymethyl)-p-cresol with another reactive phenol in the presence of a strong acid catalyst. As the other reactive phenol, there may be used phenol, cresol, dimethylphenol, trimethylphenol, naphthol, biphenol, phenylphenol, bis(hydroxyphenyl)methane, isopropylidenebiphenol, catechol, resorcinol, thiophenol and the like, which contain at least two sites on the phenyl ring(s) of sufficient reactivity to undergo facile Friedel-Crafts reactions, then the condensation reaction of the said reactive compound with a bishydroxymethylated phenolic compound can sustain polymerization and result in the formation of a high molecular weight resinous polymer binder having substantially an alternating copolymer structure. As the acid catalyst, there may be used mineral acid such as hydrochloric acid, sulfuric acid, phosphoric acid, organic acid such as formic acid, oxalic acid, toluenesulfonic acid and the like.

The substantially alternating copolymer produced by the acid catalysed condensation reaction of a bishydroxymethylated phenolic compound and a reactive phenolic compound can be further reacted in the presence of acid with formaldehyde and the same or different reactive phenolic compound. The novolac resin that is produced is substantially a block copolymer of high molecular weight suitable as binder in light-sensitive compositions.

Still another useful novolac resin matrix binder for the light-sensitive composition of the invention is derived from aromatic aldehydes. Under vigorous reaction conditions and in the presence of a strong acid such as toluenesulfonic acid and an ionizable compound of divalent sulfur aromatic aldehydes such as benzaldehyde, substituted benzaldehydes, naphthaldehyde and substituted naphthaldehydes condense with a reactive phenolic compound such as m-cresol, o-cresol and p-cresol to produce high molecular weight resins. The properties of these aromatic aldehyde-based resins may be further improved by including in the condensation reaction a bishydroxymethylated phenolic compound.

As the divalent sulfur co-catalyst, there may be used sulfur dichloride, sodium thiosulfate, hydrogen sulfide, sodium sulfide, thiols, thiophenols, thiopropionic acid, thioglycollic acid, marcapto alkylsulfonic acid, hydroxyalkylthiols and the like. The aromatic aldehyde resins provide positive-acting photoresist compositions that have high photospeed and thermal stability.

Two or more resins of similar or different compositions can be blended or combined together to give additional control of lithographic properties of positive-acting photoresist compositions. For example, blends of cresol novolac, alternating cresol novolac, block cresol novolac, polyvinyl phenol and copolymers, alkylated polyvinyl phenol and copolymers, pyrogallolketone and pyrogallol-diisopropenylbenzene condensates, catechol or resorcinol-bishydroxymethylated phenolic condensates, styrene-maleic anhydride based copolymers and the like with the aromatic aldehyde based resins can be used to improve resolution, thermal properties such as retention of image shape above 130° C., photospeed and to control dissolution behavior during the development process.

The radiation sensitive resist composition of this invention is produced by dissolving the above mentioned base-soluble matrix resin binder and the naphthoquinone-(1,2)-diazide-(2)-sulfonyl compound in a solvent. Solvents useful for this purpose include, for example, glycol ethers such as ethylene glycol monomethyl ether, ethylene glycol monoethyl ether, propylene glycol monomethyl ether and the like; Cellosolve esters such as methyl Cellosolve acetate, ethyl Cellosolve acetate and the like; acetate ethers such as propylene glycol methyl ether acetate, propylene glycol ethyl ether acetate and the like; esters such as ethyl acetate, butyl acetate, ethyl-2-ethoxy acetate, methyl-2-methoxy acetate, methyl-3-methoxy propionate, ethyl-3-methoxy propionate, ethyl lactate, methyl lactate, ethyl 2-ethoxy-2-hydroxyacetate, ethyl 2-hydroxyisobutyrate, amyl acetate, hexyl acetate, methylacetoacetate and the like; ketones such as methyl ethyl ketone, cyclohexanone, cyclopentanone and the like; and aromatic hydrocarbons such as anisole, toluene, xylene and the like. These solvents may be used in admixture of several members, considering the solubilities of the constituents, the smell, flash-point, chemical toxicity, viscosity, surface tension, rate of vaporization of the solvent from the resist film after coating, surface shape of the coating film, and the effect of retained solvent in the coating film on the resolving power and photospeed of the resist composition upon development after exposure to radiation.

Additives such as pigments, dyes, anti-striation agents, contrast enhancers, surfactants and the like may also be added to the solution of the base-soluable matrix resin binder, light-sensitive compound and solvent of this invention before the solution is coated onto a substrate.

Examples of dyes that may be used together with the resist compositions of this invention include acridine yellow G, anthroquinones, coumarin, curcumin, di- and triphenylmethanes, Disperse Yellow 54, 2-(4-hydroxyphenylazo)-benzoic acid, Macrolex 6G, Methyl Red, Mordant Orange I, oximes, phenanzines, phenylazo(4-dialkylamino)benzene, (phenylazo)resorcinol, bis(phenylazo)resorcinol, (naphthylazo)resorcinol, 1-(2-pyridylazo)-2-naphthol, Rhodamine B, Solvent Yellow 8, Sudan I, and xanthenes at about 0.2 to 8.0 percent weight levels, based on the weight of the resin and limited by the solubility of the dye. These dyes may be used alone or in admixtures of several members depending on the lithographic performance required.

The light-sensitive resist solution can be applied to a substrate to form a resist film by any conventional method used in the art, including dipping, spraying, whirling and spin coating. When spin coating, for example, the percentage of solid contents in the resist solution can be adjusted in the order to provide coating of the desired thickness depending on the spinning equipment and the spinning process.

The light-sensitive composition of the present invention affords a positive-acting photoresist of excellent quality and so is useful not only for the manufacture of very large integrated (VLSI) circuits of high quality but also as a positive-type photoresist for the production of photomasks, surface acoustic wave devices and the like. This photoresist composition is particularly useful for applications to silicon/silicon dioxide coated wafers normally used for the manufacture of VLSI. The substrate may also comprise various polymeric resins especially transparent polymers such as polyesters and polycarbonates, polyimide and materials that have good planarizing layer properties. The substrate may also comprise gallium arsenide, silicon, silicon/silicon dioxide, doped silicon dioxide, boron nitrite, silicon nitride, aluminum, glass, tantalum, tungsten, copper, polysilicon, ceramics, aluminum/copper mixtures and superconducting materials.

After the radiation sensitive resist composition is coated onto the substrate, the substrate is baked at about 80 to 120° C. until substantially all of the solvent has evaporated and only a coating of the resist composition remains on the substrate, normally giving a film thickness on the order of about 0.2 to 3 microns. The coated substrate can then be exposed to radiation, especially ultraviolet radiation, in the range of about 300 nm to about 450 nm, depending on the naphthoquinonediazidesulfonic acid ester used, to produce latent images produced by the use of suitable photomasks, projection tools, negatives, stencils, templates, etc. In the preferred embodiment, the ultraviolet exposure range is from 300 nm to about 405 nm, although ultraviolet light with wavelengths as short as 240 nm can give acceptable results.

As the developer for the exposed photoresist composition of this invention, there may be used aqueous solutions of alkalis, including inorganic alkalis such as sodium hydroxide, potassium hydroxide, sodium carbonate, sodium silicate, sodium metasilicate and the like; quaternary ammonium hydroxides, carbonates, silicates, such as tetramethylammonium hydroxide, tetraethylammonium hydroxide and the like. When producing an integrated circuit in which the use of a metal-containing developer is objectionable, the use of an aqueous solution of a quaternary ammonium salt is preferred. As the developer, there may also be used an aqueous solution prepared by adding a surfactant and development moderator to the above-mentioned aqueous alkali solutions.

The following Examples are illustrative of the invention and of the benefits of the light-sensitive composition of the invention. This invention is, however, not limited to the Examples.

EXAMPLE 1

2,6-Bis(4-hydroxy-3,5-dimethylbenzyl)-4-methylphenol was prepared in order to demonstrate at least one method for preparing the precursors to the light-sensitive oligomeric compounds of this invention.

Into a 250 ml Erlenmeyer flask equipped with a stirrer, glass cover and hotplate, was placed 36.6 g of 2,6-dimethylphenol (0.3 moles), 16.8 g of 2,6-bis-(hydroxymethyl)-4-methylphenol (0.1 mole, 97 percent purity), 100 ml of absolute ethanol and 1.0 g p-toluenesulfonic acid monohydrate. The flask was placed on the hotplate and vigorous stirring begun. The reaction mixture was slowly heated to reflux and kept at reflux for 4 hours. At the end of this period the reaction mixture was washed twice with hot water, collected on a filter and dried under a nitrogen atmosphere at 100° C. under partial vacuum. There resulted a pink oligomeric solid having only trace of 2,6-dimethylphenol. Product weight was 28.2 g, which is about 77 percent of theoretical.

Gel permeation chromatography and high pressure liquid chromatographic separations showed the product to be an admixture comprising about 75.7 percent of 2,6-Bis(4-hydroxy-3,5-dimethylbenzyl)-4-methylphenol, about 20.2 percent higher molecular weight oligomers and about 4.1 percent lower molecular weight components.

Under similar reaction conditions, nine other precursors (Examples 2-10) to the light-sensitive oligomeric compounds of the invention have been prepared. Table 1 below sets out the reactants used. Reaction conditions and work-ups are generally as described above except that glacial acetic acid was used as solvent.

TABLE 1

| Example | Reactant | Reactant | Principal Product |
|---|---|---|---|
| 2 | Phenol | 2,6-Bis(hydroxymethyl)-4-methylphenol | 2,6-Bis(4-hydroxybenzyl)-4-methylphenol |
| 3 | 2,3,6-Trimethylphenol | 2,6-Bis(hydroxymethyl)-4-methylphenol | 2,6-Bis(4-hydroxy-2,3,5-trimethylbenzyl)-4-methylphenol |
| 4 | 2,6-Diisopropylphenol | 2,6-Bis(hydroxymethyl)-4-methylphenol | 2,6-Bis(4-hydroxy-3,5-diisopropylbenzyl)-4-methylphenol |
| 5 | 2,6-Dimethoxyphenol | 2,6-Bis(hydroxymethyl)-4-methylphenol | 2,6-Bis(4-hydroxy-3,5-dimethoxybenzyl)-4-methylphenol |
| 6 | 2,6-Diphenylphenol | 2,6-Bis(hydroxymethyl)-4-methylphenol | 2,6-Bis(4-hydroxy-3,5-diphenylbenzyl)-4-methylphenol |
| 7 | 2,6-Dimethylphenol | 2,6-Bis(hydroxymethyl)-4-ethylphenol | 2,6-Bis(4-hydroxy-3,5-dimethylbenzyl)-4-ethylphenol |
| 8 | 2,6-Dimethyl-4-hydroxymethylphenol | 4-Phenylphenol | 2,6-Bis(4-hydroxy-3,5-dimethylbenzyl)-4-phenyl-phenol |
| 9 | 2,6-Dimethyl-4-hydroxymethylphenol | 2-Methylphenol | 2,4-Bis(4-hydroxy-3,5-dimethylbenzyl)-2-methylphenol |
| 10 | 2,6-Dimethyl-4-hydroxymethylphenol | 3,4-Dimethylphenol | 2,6-Bis(4-hydroxy-3,5-dimethylbenzyl)-3,4-dimethylphenol |

EXAMPLE 11

The following example pertains to the preparation of brominated 2,6-bis(4-hydroxybenzyl)-4-methylphenol. Nitrated species may be prepared by analogous methods.

15 g of 2,6-bis(4-hydroxybenzyl)-4-methylphenol was dissolved in 100 ml of methylene chloride in a Erlenmeyer flask. 7.5 g bromine in 12 ml methylene chloride was slowly added, at a temperature of about 23° C. to the phenol solution. The bromine uptake was very rapid. The reaction mixture was stirred for about 80 minutes and then concentrated to dryness by use of a rotary evaporator. The product, which was a brown powder, had a weight of about 18.5 g, 98.7 percent of theoretical yield for the monobrominated 2,6-bis(4-hydroxybenzyl)-4-methylphenol.

EXAMPLE 12

10.0 g of 2,6-bis(4-hydroxy-3,5-dimethylbenzyl)-4-methylphenol and 20.0 g of naphthoquinone-(1,2)-diazide-(2)-4-sulfonyl chloride are dissolved in 129 g of tetrahydrofuran. With stirring, a solution of 8.5 g of triethylamine and 1.0 g of 4-dimethylaminopyridine in 9.5 g tetrahydrofuran was slowly added over a 50 minute period. After the reaction mixture was stirred an additional 6 hours at room temperature 5 ml deionized water was added and the mixture stirred for an additional 20 minutes. The reaction mixture was acidified with 6 ml of concentrated HCl and then added to 6 volumes of vigorously stirred 2 percent sulfuric acid. The resulting precipitate was collected by filtration, washed twice with fresh deionized water and dried at 23° C. under partial vacuum to yield 26.3 g (96.3 percent of theoretical) of product. The resulting compound is that of formula I wherein X is naphthoquinone-(1,2)-diazide-(2)-4-sulfonyl.

EXAMPLE 13

The process of Example 12 is repeated, wherein the reactants are the precursor described in Example 1 and naphthoquinone-(1,2)-diazide-(2)-5-sulfonyl chloride, in order to produce the compounds of formula 1 wherein X is naphthoquinone-(1,2)-diazide-(2)-5-sulfonyl.

Under similar reaction conditions, various kinds of naphthoquinone-(1,2)-diazide-(2)-sulfonic acid ester derivatives can be prepared [Examples 14–16] by use of different kinds of substituted phenolic oligomeric precursors. Table 2 sets out the precursor and the X group used to form the compound of formula 1.

TABLE 2

| Example | Precursor | X Group |
|---|---|---|
| 14 | Product of Example 2 | Naphthoquinone-(1-2)-diazide-(2)-4-sulfonyl |
| 15 | Product of Example 3 | Naphthoquinone-(1-2)-diazide-(2)-4-sulfonyl |
| 16 | Product of Example 4 | Naphthoquinone-(1-2)-diazide-(2)-4-sulfonyl |
| 17 | Product of Example 5 | Naphthoquinone-(1-2)-diazide-(2)-4-sulfonyl |
| 18 | Product of Example 6 | Naphthoquinone-(1-2)-diazide-(2)-4-sulfonyl |
| 19 | Product of Example 7 | Naphthoquinone-(1-2)-diazide-(2)-4-sulfonyl |
| 20 | Product of Example 8 | Naphthoquinone-(1-2)-diazide-(2)-4-sulfonyl |
| 21 | Product of Example 9 | Naphthoquinone-(1-2)-diazide-(2)-4-sulfonyl |
| 22 | Product of Example 10 | Naphthoquinone-(1-2)-diazide-(2)-4-sulfonyl |
| 23 | Product of Example 11 | Naphthoquinone-(1-2)-diazide-(2)-4-sulfonyl |
| 24 | Product of Example 4 | Naphthoquinone-(1,2)-diazide-(2)-5-sulfonyl |
| 25 | Product of Example 5 | Naphthoquinone-(1,2)-diazide-(2)-5-sulfonyl |
| 26 | Product of Example 9 | Naphthoquinone-(1,2)-diazide-(2)-5-sulfonyl |

EXAMPLE 27

A 2-L four-neck resin kettle equipped with a stirrer, heating source, thermometer, variable reflux ratio distilling head and a nitrogen inlet tube was charged with 278.3 g (99 percent pure) m-cresol, 335.5 g (99 percent pure) p-cresol, 34.3 g (99 percent pure) o-cresol, 68.3 g of 36.9 percent formalin, 20 ml of deionized water and 12.0 g of oxalic acid dihydrate. The mixture was heated to about 60° C. at which point an exothermic condensation reaction ensued. When the reaction mixture temperature reached about 100° C. 273.3 g of 36.9 percent formalin was added in about 30 minutes. The reaction was then allowed to continue for about 4 hours at reflux temperature. The more volatile components in the reaction mixture were removed by distillation at ambient pressure under a constant flow of nitrogen. When the temperature of the reaction mixture reached about 220° C. a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 516 g of novolac resin was obtained having a glass transition temperature, Tg, of about 100° C. was obtained.

EXAMPLE 28

A light-sensitive composition solution was prepared by dissolving 1.52 g of light-sensitive compound of Example 12, 11.12 g of the base-soluble novolac resin of Example 27 into 22.44 g ethyl lactate, 11.22 g anisole and 3.74 g amyl acetate and filtering the resulting solution through a 0.2 micrometer filter prior to use.

After the above light-sensitive composition solution was spin-coated onto a 4 inch silicon wafer, it was prebaked using a track hotplate soft-bake set at 105° C. for 30 seconds to form a coating film of light-sensitive composition having a thickness of 1.2 microns. The coating film was exposed to 135 mJ/cm$^2$ of ultraviolet radiation using a Perkin-Elmer 341 scanning optical projector. The exposed coating film was baked at 115° C. for 45 seconds and developed by immersion into a bath of 0.265 molar aqueous tetramethylammonium hydroxide at 25° C. for 90 seconds. The resulting patterns were inspected with a scanning electron microscope showing multiple equal 1.25 microns line and spaces were resolved and greater than 99 percent of the original unexposed film thickness remained. It appears from these results that this light-sensitive composition is high in sensitivity, resolution capability and resistance to the developer.

EXAMPLE 29

A light-sensitive composition solution was prepared by repeating the same procedure as in Example 28, except that 1.48 g of the light-sensitive compound of Example 13 was used instead. Then, the light-sensitive composition was evaluated by the same methods as in Example 28 except that no post exposure bake was used. As a result, it was found that the ultraviolet exposure energy necessary for resolving the 1.25 microns equal lines/spaces pattern was 120 mJ/cm$^2$ and the yield of residual film thickness was greater than 99 percent. It appears from these results that this radiation sensitive composition is high in both sensitivity and resistance to the developer.

EXAMPLES 30 THROUGH 39

Light-sensitive composition solutions prepared by repeating the same procedure as in Example 28 are evaluated by the same methods described herein. In each case the substituents on the oligomeric phenolic ballast molecule are varied and in each case the naphthoquinone-(1,2)-diazide-(2)-sulfonyl residue is the naphthoquinone-(1,2)-diazide-(2)-4-sulfonyl residue. The radiation sensitive compounds used and the ultraviolet exposure necessary for resolving the 1.25 microns equal lines/spaces pattern are shown in Table 3. The original unexposed film thickness remaining after development was in all cases greater than 99 percent. It appears from these results that the radiation sensitive compositions of the invention are high in sensitivity, resolution and retention of the original unexposed film thickness after development.

TABLE 3

| Example | Radiation Sensitive compound of Example | Exposure Energy (mJ/cm$^2$) |
|---|---|---|
| 30 | 14 | 130 |
| 31 | 15 | 184 |
| 32 | 16 | 95 |
| 33 | 17 | 125 |
| 34 | 18 | 242 |
| 35 | 19 | 145 |
| 36 | 20 | 125 |
| 37 | 21 | 135 |
| 38 | 22 | 135 |
| 39 | 23 | 135 |

EXAMPLE 40

A phenolic resin rich in regularly alternating phenolic copolymer block segments was formed by reacting a mixture comprising 519.0 g of 99 percent pure m-cresol, 538.2 g 97 percent pure 2,6-bis(hydroxymethyl)-p-cresol and 20 g oxalic acid dihydrate in a solvent mixture of 40 ml deionized water and 200 ml ethyl cellosolve acetate. The reactants mixture was heated to about 70° C. to initiate the reaction forming the copolymer block segments. At 102° C. 32.6 g of 36.9 percent formaldehyde was added in 8 minutes to the reaction mixture to form substantially m-cresol formaldehyde block segments and to chemically bond these segments to the previously formed copolymer blocks. After heating the mixture at reflux for three hours the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of product was obtained having a Tg of 112° C. was obtained.

Then, a light-sensitive resist composition solution was prepared by dissolving 1.52 g of radiation sensitive compound of Example 12, 11.12 g of the base-soluble novolac resin obtained above in 22.44 g ethyl lactate, 11.22 g anisole and 3.74 g amyl acetate and filtering the resulting solution through a 0.2 micron filter prior to use. The light-sensitive resist composition was evaluated by the same methods as in Example 28. As a result, it was found that the ultraviolet exposure energy necessary to resolve a pattern having equal line/spaces of 1.25 micron was 105 mJ/cm$^2$ and retention of the initial film thickness was greater than 99 percent.

EXAMPLE 41

Radiation sensitive resist compositions containing a mixture of dyes can have certain advantages when compared to other radiation sensitive resist compositions containing a single dye. The advantages of an admixture of dyes relate to important control of the dissolution rate of the exposed/unexposed resist composition, improved solubility of the dyes, improved resist composition stability, and an improved balance of absorption at the lithographically important wavelengths of 365 nm, 404 nm and 436 nm.

A light-sensitive resist composition solution was prepared by dissolving 2.432 g of the radiation sensitive compound of Example 12, 0.1 g of the dye (4-phenylazo)resorcinol, 0.1 g of the dye bis(phenylazo)-resorcinol, 10.168 g of the resin of Example 27 into a solvent mixture consisting of 22.44 g ethyl lactate, 11.22 g of anisole and 3.74 g of amyl acetate. The solution was filtered through a 0.2 micron filter prior to use.

The light-sensitive composition was evaluated by spin-coating films onto a 4 inch (10 cm) silicon wafer using a track hotplate soft-bake set at 115° C. for 45 seconds. The resist film was exposed in the said manner described above. The resist composition was developed by immersing into a bath of 0.29 molar aqueous tetramethylammonium hydroxide at 22° C. for 60 seconds, followed by rinsing in water. As a result, it was found that the ultraviolet exposure energy necessary for resolving patterns having line width of 1.25 micron was 87 mJ/cm$^2$ and residual film thickness after development was 97 percent.

EXAMPLE 42

A mixture of 162.2 g m-cresol, 111.4 g benzaldehyde, 55.0 g salicylaldehyde, 3.0 g 3-mercaptopropionic acid, 1.1 g p-toluenesulfonic acid monohydrate and 75 ml diglyme were charged into a 1-L reaction vessel equipped with a paddle stirrer, reflux condenser and a nitrogen inlet tube. The mixture was heated to reflux and maintained at reflux for 4 hours. The more volatile components in the reaction mixture were distilled at ambient pressure until the mixture temperature climbed to about 170° C. This temperature was maintained for two hours before the reaction mixture was cooled and diluted with 300 ml of a 1:2 acetic acid-methanol mixture. The product was precipitated into 2.3-L deionized water, washed with water and dried under vacuum at about 115° C. About 293 g of a beige powder suitable as binder in resist compositions was obtained.

Then, a radiation sensitive composition solution was prepared by dissolving 15.26 g of the base-soluble novolac resin obtained above, 2.08 g of the light-sensitive compound of Example 12, 28.15 g ethyl lactate, 14.07 g anisole and 4.69 g amyl acetate and filtering the resulting solution through a filter having a pore size of 0.2 micron. Then, the radiation sensitive composition was evaluated by spin-coating films onto a 4 inch silicon wafer using a track hotplate soft-bake set at 115° C. for 45 seconds. The resist film was exposed in the said manner described above. The resist composition was developed by immersing into a bath of 0.27 molar aqueous tetramethylammonium hydroxide at 22° C. for 60 seconds, followed by rinsing in water. As a result, it was found that the ultraviolet exposure energy necessary for resolving patterns having line width of 1.50 micron was 128 mJ/cm$^2$ and residual film thickness after development was greater than 97 percent.

EXAMPLE 43

A light-sensitive composition solution was prepared by dissolving 13.43 g of the base-soluble novolac resin synthesized in Example 42 1.83 g of a pyrogallol-acetone condensation resin having a number average molecular weight of about 937 Daltons, 2.08 g of the radiation sensitive compound of Example 12, 28.15 g ethyl lactate, 14.07 g anisole and 4.69 g amyl acetate and filtering the resulting solution through a filter having a pore size of 0.2 micron. Then, the light-sensitive composition was evaluated by spin-coating films onto a 4 (10 cm) inch silicon wafer using a track hotplate soft-bake set at 115° C. for 45 seconds. The resist film was exposed in the said manner described above. The resist composition was developed by immersing into a bath of 0.23 molar aqueous tetramethylammonium hydroxide at 23° C. for 60 seconds, followed by rinsing in water. As a result, it was found that the ultraviolet exposure energy necessary for resolving patterns having line width of 1.25 micron was 100 mJ/cm$^2$ and residual film thickness after development was greater than 99 percent. It is apparent from these results that this resist composition has good photospeed, and is high in both resolution and retention of residual film thickness.

EXAMPLE 44

A radiation sensitive composition solution was prepared by dissolving 3.88 g of the base-soluble novolac resin synthesized in Example 42, 1.67 g of the base-soluble novolac resin prepare in Example 27 and 0.757 g of the radiation sensitive compound of Example 12, in 11.22 g ethyl lactate, 5.61 g anisole and 1.87 g amyl acetate and filtering the resulting solution through a 0.2 micron filter prior to use. Then, the radiation sensitive composition was evaluated using the method of Example 28. As a result, it was found that the ultraviolet exposure energy necessary for resolving patterns having line width of 1.25 micron was 425 mJ/cm$^2$ and residual film thickness after development was greater than 99 percent. It is apparent from these results that this resist composition is high in both resolution and retention of residual film thickness.

EXAMPLES 45 THROUGH 49

Radiation sensitive resist compositions continuing blends of naphthoquinone diazide compounds can demonstrate useful lithographic performance. Such blends can improve solubility, dissolution rates, coating properties, contrast, etch resistance, photospeed, resolution or feature profiles.

Photoresist compositions were prepared by dissolving 1.60 g of the radiation sensitive compound described in Table 4, 0.53 g of naphthoquinone-(1,2)-diazide-(2)-5-sulfonyl ester of trihydroxybenzophenone, 7.46 g of the base-soluble resin of Example 42, 3.20 g of the base-soluble resin of Example 27 and 37.2 g of purified ethyl lactate free of diethylsuccinate. Following complete dissolution, the resist was filtered through a 0.2 μm teflon filter. The radiation sensitive coating was evaluated by spin-coating the films onto a 4 inch (10 cm) silicon wafer using a track hotplate soft-bake at 115° C. for 45 seconds. The resist films were exposed on a Perkin Elmer 341 projection scanner in the manner described earlier. Following exposure, the films were treated with a post-bake at 115° C. for 45 seconds. The radiation sensitive compounds used and the ultraviolet exposure energy necessary for resolving 1.25 μm equal lines/spaces pattern are shown in Table 4. The resist compositions were developed by immersing into a bath of 0.245 molar aqueous tetramethylammonium hydroxide at 21° C. for 60 seconds, followed by rinsing in water. The original film thickness remaining after development was, in all cases, greater than 97%. It appears from these results that the radiation sensitive compositions of the present invention are high in sensitivity, resolution and retention of the unexposed film thickness after development. Even faster photospeeds can be obtained while maintaining acceptable lithographic performance, if desired, by increasing the alkalinity of the developer bath.

TABLE 4

| Example | Radiation Sensitive compound of Example | Exposure Energy (mJ/cm$^2$) |
| --- | --- | --- |
| 45 | 13 | 120 |
| 46 | 24 | 145 |
| 47 | 25 | 128 |
| 48 | 26 | 136 |
| 49 | 12 | 135 |

EXAMPLE 50

Radiation sensitive compositions containing a blend of diazonaphthoquinone diazide compounds and a mixture of dyes can further improve solution stability compared to compositions containing only single photoactive and dye components.

A light sensitive composition was prepared by dissolving 1.60 g of the radiation sensitive compound of Example 13, 0.53 g of naphthoquinone-(1,2)-diazide-(2)-5-sulfonyl ester of trihydroxybenzophenone, 7.33 of the base-soluble resin of Example 42, 3.14 g of the base-soluble resin of Example 27, 0.09 g of the dye (4-phenylazo)resorcinol, 0.09 g of the dye bis(phenylazo)-resorcinol and 37.2 g of purified ethyl lactate. Following complete dissolution, the resist was filtered through a 0.2 μm teflon filter.

The resist composition was lithographically processed as described above. The photospeed was found to be 175 mJ/cm$^2$, with a resolution of 1.25 μm and the unexposed film thickness remaining after development of over 98 percent.

What is claimed is:

1. A positive type photoresist composition comprising a mixture of an base-soluble resin and radiation sensitive oligomeric component consisting essentially of a compound of the formula

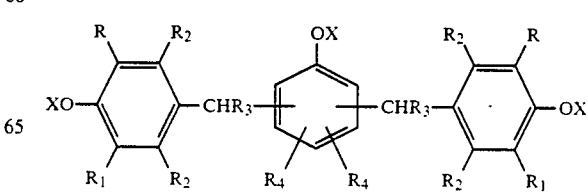

where: X is hydrogen or a naphthoquinone-(1,2)-diazide-(2)-sulfonyl residue; but at least one X is a naphthoquinone-(1,2)-diazide-(2)-sulfonyl residue; R, R$_1$, R$_2$ and R$_4$ are hydrogen, a halogen, an alkyl group free of a tertiary alpha-carbon atom, an alkoxy group having 1 to 4 carbon atoms, an aryl group or an arylalkyl group; in addition, R$_2$ and R$_4$ may be a nitro or an acyl group having 2 to 4 carbon atoms; R$_3$ is hydrogen, an alkyl, an aaryl, or a heterocyclic group, but preferably is H; in addition, R$_4$ may be a tertiary alkyl group; wherein the weight ratio of the said resin to said radiation sensitive oligomeric compound is in the range of from about 1:1 to about 10:0.5.

2. A composition as claimed in claim 1 wherein R and R$_1$ are alkyl groups free of tertiary alpha-carbon atoms, one R$_2$ is hydrogen, and the other R$_2$ an alkyl group having 1 to 4 carbon atoms and being free of tertiary alpha-carbon atoms, an aryl, a halogen, or a nitro or acyl group having 2 to 4 carbon atoms, and R$_4$ is hydrogen, an alkyl group having 1 to 4 carbon atoms and being free of tertiary alpha-carbon atoms, an aryl, a halogen, a nitro, an acyl group having 2 to 4 carbon atoms or a tertiary alkyl group.

3. A composition as claimed in claim 2 wherein R and R$_1$ are methyl groups.

4. A composition as claimed in claim 3 wherein the other R$_2$ is methyl.

5. A composition as claimed in claim 3 wherein the other R$_2$ is hydrogen.

6. A composition as claimed in claim 3 wherein one R$_4$ is hydrogen and the other methyl.

7. The composition of claim 1 wherein X is a naphthoquinone-(1,2)-diazide-(2)-4-sulfonyl residue.

8. The composition of claim 1 wherein X is a naphthoquinone-(1,2)-diazide-(2)-5-sulfonyl residue.

9. The composition of claim 1 wherein said resin is a hydroxy aryl resin.

10. The composition of claim 9 wherein said resin is a novolac resin.

11. The composition of claim 10 wherein said resin is substantially a cresol-formaldehyde novolac resin.

12. The composition of claim 9 wherein said resin is formed by condensing in the presence of acid at least one bishydroxymethyl substituted phenolic compound and at least one reactive phenolic compound capable of sustaining polymerization.

13. The composition of claim 9 wherein said resin is substantially a block copolymer formed by condensing in the presence of acid the resin of claim 12 with formaldehyde and at least one reactive phenolic compound capable of sustaining polymerization.

14. The composition of claim 12 wherein said bishydroxymethyl substituted phenolic compound is 2,6-bis(-hydroxymethyl)-p-alkylphenol wherein the alkyl group has 1 to 4 carbon atoms..

15. The composition of claim 9 wherein said resin is formed by condensing in the presence of acid and a divalent sulfur compound a mixture of at least one aromatic aldehyde with at least one reactive phenolic compound capable of sustaining polymerization, said polymer having a weight-average molecular weight of at least 1500 Daltons.

16. The composition of claim 15 wherein said aromatic aldehyde is selected from the group consisting of benzaldehyde, salicylaldehyde, 3-hydroxybenzaldehyde, 4-hydroxybenzaldehyde and 1-naphthaldehyde and said reactive phenolic compound is cresol.

17. The composition of claim 9 wherein said resin is an admixture of resin of claim 11 with resin of claim 15, and wherein the weight ratio of the said resin of claim 11 to said resin of claim 15 is in the range of 49:1 to about 1:49.

18. The composition of claim 9 wherein said resin is an admixture of the resin of claim 15 with the polycondensation product of phenol having two or more hydroxy groups and a ketone, and wherein the weight ratio of the said resin of claim 15 to said polycondensation product of phenol and ketone is 49:1 to about 20:30.

19. The composition of claim 18 wherein said phenol is pyrogallol and said ketone is selected from the group consisting of acetone, acetophenone, cyclohexanone, cyclopentanone and methylethylketone.

20. The composition of claim 1 wherein said resin is a cresol-formaldehyde novolac resin and X is a naphthoquinone-(1,2)-diazide-(2)-4-sulfonyl residue and the ratio by weight of said resin to said naphthoquinone derivative is in the range from about 4:1 to about 10:0.5.

21. The composition of claim 1 wherein said resin is a cresol-formaldehyde novolac resin and X is a naphthoquinone-(1,2)-diazide-(2)-5-sulfonyl residue and the ratio by weight of said resin to said naphthoquinone derivative is in the range from about 4:1 to about 10:0.5.

22. The composition of claim 1 wherein said resin is formed by condensing in the presence of acid at least one bishydroxymethyl substituted phenolic compound and at least one reactive phenolic compound capable of sustaining polymerization and X is a naphthoquinone-(1,2)-diazide-(2)-4-sulfonyl residue and the ratio by weight of said resin to said naphthoquinone derivative is in the range of from about 4:1 to about 10:0.5.

23. The composition of claim 1 wherein said resin is formed by condensing in the presence of acid at least one bishydroxymethyl substituted phenolic compound and at least one reactive phenolic compound capable of sustaining polymerization and X is a naphthoquinone-(1,2)-diazide-(2)-5-sulfonyl residue and the ratio by weight of said resin to said naphthoquinone derivative is in the range from about 4:1 to about 10:0.5.

24. The composition of claim 1 wherein said resin is substantially a block copolymer formed by condensing in the presence of acid the resin of claim 12 with formaldehyde and at least one reactive phenolic compound capable of sustaining polymerization and X is a naphthoquinone-(1,2)-diazide-(2)-4-sulfonyl residue and the ratio by weight of said resin to said naphthoquinone derivative is in the range of from about 4:1 to about 10:0.5.

25. The composition of claim 1 wherein said resin is substantially a block copolymer formed by condensing in the presence of acid the resin composition of claim 12 with formaldehyde and at least one reactive phenolic compound capable of sustaining polymerization and X is a naphthoquinone-(1,2)-diazide-(2)-5-sulfonyl residue and the ratio by weight of said resin to said naphthoquinone derivative is in the range from about 4:1 to about 10:0.5.

26. The composition of claim 1 wherein said resin is formed by condensing in the presence of acid and a divalent sulfur compound a mixture of at least one aromatic aldehyde with at least one reactive phenolic compound capable of sustaining polymerization and X is a naphthoquinone-(1,2)-diazide-(2)-4-sulfonyl residue and the ratio by weight of said resin to said naphthoquinone derivative is in the range of from about 4:1 to about 10:0.5.

27. The composition of claim 1 wherein said resin is formed by condensing in the presence of acid and a divalent sulfur compound a mixture of at least one aromatic aldehyde with at least one reactive phenolic compound capable of sustaining polymerization and X is a naphthoquinone-(1,2)-diazide-(2)-5-sulfonyl residue and the ratio by weight of said resin to said naphthoquinone derivative is in the range from about 4:1 to about 10:0.5.

28. The composition of claim 1 wherein said resin is an admixture of the resin of claim 11 with the resin of claim 15, and wherein the weight ratio of the said resin of claim 11 to said resin of claim 15 is in the range of 49:1 to 1:49 and X is a naphthoquinone-(1,2)-diazide-(2)-4-sulfonyl residue and the ratio by weight of said resin admixture to said naphthoquinone derivative is in the range of from about 4:1 to about 10:0.5.

29. The composition of claim 1 wherein said resin is an admixture of the composition of claim 11 with the resin of claim 15, and wherein the weight ratio of the said resin of claim 11 to said resin of claim 15 is in the range of 49:1 to 1:49 and X is a naphthoquinone-(1,2)-diazide-(2)-5-sulfonyl residue and the ratio by weight of said resin admixture to said naphthoquinone derivative is in the range from about 4:1 to about 10:0.5.

30. The composition of claim 1 wherein said resin is an admixture of the resin of claim 15 with the polycondensation product of phenol having two or more hydroxy groups and a ketone, and the weight ratio of the said resin of claim 15 to said polycondensation product of phenol and ketone is about 49:1 to about 20:30 and X is a naphthoquinone-(1,2)-diazide-(2)-4-sulfonyl residue and the ratio by weight of said resin admixture to said naphthoquinone derivative is in the range of from about 4:1 to about 10:0.5.

31. The composition of claim 1 wherein said resin is an admixture of the resin of claim 15 with the polycondensation product of phenol having two or more hydroxy groups and a ketone, and the weight ratio of the said resin of claim 15 to said polycondensation product of phenol and ketone is about 49:1 to about 20:30 and X is a naphthoquinone-(1,2)-diazide-(2)-5-sulfonyl residue and the ratio by weight of said resin admixture to said naphthoquinone derivative is in the range from about 4:1 to about 10:0.5.

32. The composition of claim 1 further comprising one or more other photosensitive additives.

33. The composition of claim 32, wherein said additive is the naphthoquinone diazide ester of trihydroxybenzophenone.

34. The composition of claim 33, wherein the weight ratio of the radiation sensitive oligomeric component of claim 1 to the naphthoquinone diazide ester of trihydroxybenzophenone is in the range of about 20:1 to 1:20.

35. The composition of claim 33, wherein said resin is an admixture of the resin of claim 11 with the resin of claim 15.

36. The composition of claim 1 further comprising one or more additives selected from the group consisting of pigments, dyes, anti-striation agents, resolution enhancers and solvent.

37. The composition of claim 36 wherein said dye is substantially an admixture of bis(phenylazo)resorcinol with one or more dye compounds selected from the group consisting of Coumarin 314, curcumin, Disperse Yellow 54, Macrolex 6G, 4-phenylazoresorcinol and Rhodamine B, and wherein the proportion by weight of said dye admixture to resin binder is in the range of about 0.4 to about 8 percent.

38. The composition of claim 36 wherein said solvent is an admixture of amyl acetate, anisole and ethyl lactate.

39. The composition of claim 36 wherein said solvent is substantially ethyl lactate.

40. A positive type photoresist which comprises the composition of claim 1 coated on a support wherein said support comprises one or more materials selected from the group consisting of polyester, polyimide, planarizing layer, silicon, gallium arsenide, silicon/silicon dioxide, doped silicon dioxide, silicon nitride, aluminum, tungsten, glass, boron nitride, aluminum/copper mixtures, tantalum, copper, polysilicon and superconducting materials.

41. A radiation sensitive oligomeric compound of the formula:

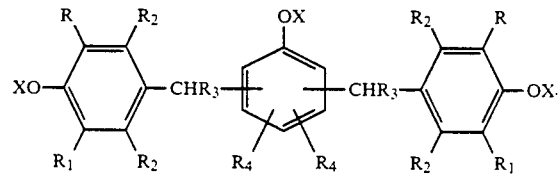

where: X is hydrogen or a naphthoquinone-(1,2)-diazide-(2)sulfonyl residue; but at least one X is a naphthoquinone-(1,2)-diazide-(2)-sulfonyl residue; R, $R_1$, $R_2$ and $R_4$ are hydrogen, a halogen, an alkyl group free of tertiary alpha-carbon atom, and alkoxy group having 1 to 4 carbon atoms, an aryl group or an arylalkyl group; in addition $R_2$ and $R_4$ may be a nitro or an acyl group having 2 to 4 carbon atoms; $R_3$ is hydrogen, an alkyl, an aryl, or a heterocyclic group, but preferably is H; in addition $R_4$ may be a tertiary alkyl group, and the weight ratio of the said resin to said radiation sensitive oligomeric component is in the range from about 1:1 to about 10:0.5.

42. A radiation sensitive oligomeric compound as claimed in claim 41 wherein R and $R_1$ are alkyl groups free of tertiary alpha-carbon atoms, one $R_2$ is hydrogen, and the other $R_2$ is an alkyl group having 1 to 4 carbon atoms and being free of tertiary alpha-carbon atoms, an aryl, a halogen, a nitro or an acyl group having 2 to 4 carbon atoms and $R_4$ is hydrogen, an alkyl group having 1 to 4 carbon atoms and being free of tertiary alpha-carbon atoms, an aryl, a halogen, a nitro or an acyl group having 2 to 4 carbon atoms or a tertiary alkyl group.

43. A radiation sensitive oligomeric compound claimed in claim 42 wherein R and $R_1$ are methyl groups.

44. A radiation sensitive oligomeric compound claimed in claim 43 wherein a substantial portion of the other $R_2$ is methyl.

45. A radiation sensitive oligomeric compound claimed in claim 43 wherein the other $R_2$ is hydrogen.

46. A radiation sensitive oligomeric compound claimed in claim 43 wherein one $R_4$ is hydrogen and the other methyl.

47. The composition of claim 41 wherein X is a naphthoquinone-(1,2)-diazide-(2)-4-sulfonyl residue.

48. The composition of claim 41 wherein X is a naphthoquinone-(1,2)-diazide-(2)-5-sulfonyl residue.

* * * * *